United States Patent [19]

Russell

[11] Patent Number: 5,827,570
[45] Date of Patent: Oct. 27, 1998

[54] COMPOSITE CERAMIC ARTICLES AND METHOD FOR MAKING SUCH ARTICLES

[75] Inventor: William C. Russell, Birmingham, Mich.

[73] Assignee: Valenite Inc., Madison Heights, Mich.

[21] Appl. No.: 721,050

[22] Filed: Sep. 25, 1996

Related U.S. Application Data

[63] Continuation of Ser. No. 251,155, May 31, 1994, abandoned.

[51] Int. Cl.$^6$ .................................................. C23C 16/40
[52] U.S. Cl. ..................... 427/255; 427/255.3; 427/255.7
[58] Field of Search ................................ 427/255, 255.3, 427/255.7

[56] References Cited

U.S. PATENT DOCUMENTS

| | | | |
|---|---|---|---|
| Re. 31,526 | 2/1984 | Smith et al. | 427/255.2 |
| 4,112,148 | 9/1978 | Fonzi | 427/255.3 |
| 4,619,866 | 10/1986 | Smith et al. | |
| 4,701,384 | 10/1987 | Sarin et al. | |
| 4,745,010 | 5/1988 | Sarin et al. | |
| 4,751,109 | 6/1988 | Sarin et al. | 427/255.3 |
| 4,844,951 | 7/1989 | Sarin et al. | 427/255.2 |
| 4,957,780 | 9/1990 | Sarin et al. | 427/255.3 |
| 5,035,923 | 7/1991 | Sarin | 427/255 |

FOREIGN PATENT DOCUMENTS

| | | |
|---|---|---|
| 57-39168 | 3/1982 | Japan . |
| 61-201778 | 9/1986 | Japan . |

*Primary Examiner*—Shrive Beck
*Assistant Examiner*—Timothy Meeks
*Attorney, Agent, or Firm*—Mary K. Cameron

[57] ABSTRACT

A cemented carbide or ceramic substrate has a wear-resistant composite ceramic coating comprising a doped two-phase metal oxide layer comprising a fully dense, adherent, continuous metal oxide phase and a fully dense, adherent, discontinuous metal oxide phase. The continuous metal oxide phase comprises aluminum oxide, yttrium oxide, or zirconium oxide, and the discontinuous metal oxide phase comprises a dispersed, discrete second phase of aluminum oxide, yttrium oxide, or zirconium oxide, with the continuous metal oxide phase being of a different metal oxide from that of the discontinuous metal oxide phase. The continuous metal oxide phase, and/or the discontinuous metal oxide phase, contains a dopant comprising at least one member selected from the group consisting of sulfur, selenium, tellurium, phosphorus, arsenic, antimony, and bismuth. The wear-resistant composite ceramic coating is deposited on a cemented carbide or ceramic substrate by passing a first metal halide gas, a volatile oxidizing gas, a second metal halide gas, a carrier gas, and a dopant, over the substrate at a temperature of from about 700° to 1250° C., and at a pressure of from about 1 torr to ambient pressure, so that the continuous and discontinuous metal oxide phases are deposited on the substrate.

31 Claims, 3 Drawing Sheets

COMPOSITE CERAMIC ARTICLES AND METHOD FOR MAKING SUCH ARTICLES

This is a continuation of U.S. patent application Ser. No. 08/251,155, filed May 31, 1994 now abandoned.

BACKGROUND OF THE INVENTION

1. Field of the Invention

The present invention relates to articles having a wear-resistant composite ceramic coating thereon, and methods for making such articles. More particularly, the present invention relates to cemented carbide cutting inserts and ceramic cutting inserts, having a two or more phase composite metal oxide coating deposited thereon, and method for making such cutting inserts. These cutting inserts are especially useful for the high speed turning of ferrous metals.

2. Description of Background and Other Information

Cemented carbide materials are known and are used extensively in such applications as mining tool bits, metal cutting and boring tools, metal drawing dies, wear-resistant machine parts, and the like. It is also known that the service properties such as wear, high temperature, and chemical resistance of such materials may be enhanced by the application of one or more thin coatings of, for example, metal carbides, metal nitrides, or ceramics. Great strides have been made in improved performance of these coated substrates, for example in machining applications, by refinement of the substrate compositions and by applying various combinations of superimposed layers of coating materials. However, increasingly stringent use conditions, for example use at high cutting speeds or at extremely high temperatures and/or corrosive environments, are placing increasing demands upon the performance of such materials.

U.S. Pat. No. 4,701,384 is directed to composite coatings on cemented carbide substrates, and discloses a wear-resistant article, such as a cutting tool, comprising a cemented carbide substrate with a composite ceramic coating of at least two phases. The first phase is a continuous metal oxide matrix layer 0.1–20 microns thick, comprising oxides of aluminum, yttrium, or zirconium. At least one discontinuous second or additional phase of oxides of aluminum, zirconium, or yttrium, or solid solutions thereof, is dispersed as a discrete second phase within the matrix layer. The additional phase material is different from the matrix material.

U.S. Pat. No. 4,745,010 is directed to a process for depositing a composite ceramic coating on a cemented carbide substrate, and discloses a wear-resistant article, such as a cutting tool. Gaseous halides of two or more of aluminum, zirconium, and yttrium, with other reactants, are passed over a cemented carbide substrate at 900°–125° C., at a pressure of from 1 torr to ambient pressure, to form a composite ceramic coating on the substrate. The coating is a continuous first-phase metal oxide matrix having particles of at least one different metal oxide dispersed therein. In a preferred process, one or more of the metal halides is pulsed into the gaseous mixture containing a different metal halide to control the deposition of the particles.

U.S. Pat. No. 4,619,866 is directed to a method of making a coated cemented carbide body and the article resulting therefrom, and discloses an improved method of coating of cemented carbide or ceramics with thin, wear-resistant layers of ceramic oxide, particularly aluminum oxide, by chemical vapor deposition. The disclosed method utilizes a dopant selected from the group consisting of sulfur, selenium, tellurium, phosphorous, arsenic, antimony, bismuth and mixtures thereof. The method is disclosed as obtaining an increased rate of growth of the wear-resistant layer, as well as obtaining optimized properties regarding evenness and thickness of the layer, making the resulting article better suited for cutting operations.

SUMMARY OF THE INVENTION

One aspect of the present invention pertains to a process for depositing a wear-resistant composite ceramic coating on a substrate. The substrate comprises at least one member selected from the group consisting of cemented carbide and ceramic. The process comprises passing (1) a first metal halide gas, (2) a second metal halide gas, (3) a volatile oxidizing gas, (4) a carrier gas, and (5) a dopant, over the substrate, so that a two-phase wear-resistant metal oxide layer is deposited on the substrate. The composite ceramic coating comprising a two-phase metal oxide layer comprises a fully dense, adherent, continuous metal oxide phase and a fully dense, adherent, discontinuous metal oxide phase.

The first metal halide gas comprises a member selected from the group consisting of aluminum halide, yttrium halide, and zirconium halide. The first metal halide gas is passed over the substrate at a partial pressure, flow rate, and substrate exposure time, to deposit on the substrate and form the continuous metal oxide phase, which comprises a metal oxide of the first metal halide gas.

The second metal halide gas comprises a member selected from the group consisting of aluminum halide, yttrium halide, and zirconium halide. The second metal halide gas, which is different from the first metal halide gas, is mixed with the first metal halide gas, and is passed over the substrate at a partial pressure, flow rate, and substrate exposure time, to deposit on the substrate and form the discontinuous metal oxide phase, which comprises a metal oxide of the second metal halide gas. The discontinuous metal oxide phase is dispersed as a discrete second phase within the continuous metal oxide phase.

The dopant comprises at least one member selected from the group consisting of sulfur, a compound of sulfur, selenium, a compound of selenium, tellurium, a compound of tellurium, phosphorus, a compound of phosphorus, arsenic, a compound of arsenic, antimony, a compound of antimony, bismuth, and a compound of bismuth. The dopant is present during the deposition of the metal oxides. Preferably, the dopant is added to at least one member selected from the group consisting of the carrier gas and the oxidizing gas, in an amount of from about 0.003 to 1 percent, based on a total gas volume. More preferably, the dopant is added to at least one member selected from the group consisting of the carrier gas or gases and said oxidizing gas, in an amount of from about 0.02 to 0.3 percent, based on a total gas volume.

Optionally, the process further comprises depositing an intermediate layer between the substrate and the wear-resistant composite ceramic coating. Preferably, the intermediate layer has a thickness of from about 0.5 to 10 microns, and comprises at least one member selected from the group consisting of carbides, nitrides, carbonitrides, oxides, and borides, of at least one member selected from the group consisting of titanium, zirconium, hafnium, vanadium, niobium, tantalum, chromium, molybdenum, tungsten, and silicon. Preferably, the intermediate layer comprises at least one member selected from the group consisting of TiC and TiN, and preferably the intermediate layer has a thickness of from about 1 to 8 microns.

Preferably, the second metal halide gas is mixed with the first metal halide gas during the deposition of the two-phase metal oxide layer. Preferably, the mixing of the second metal halide gas into the first metal halide gas is carried out so that a size and distribution of the discontinuous metal oxide phase is determined by: (1) the partial pressure of the second metal halide gas; (2) the temperature of the reactor for the chemical vapor deposition reactions, and (3) the degree of mixing of the metal halides.

Optionally, the deposition of the continuous metal oxide phase is carried out for a sufficient time before the mixing step is begun, so that a single-phase, continuous metal oxide layer is formed between the substrate and the two-phase metal oxide layer.

Optionally, pulsing of the second metal halide gas may be carried out during deposition of the first metal oxide on the substrate, so that a stratified, wear-resistant composite ceramic coating comprising at least two two-phase metal oxide layers and at least one single-phase, continuous metal oxide layer, is formed. Optionally, pulsing of the second metal halide gas may be carried out intermittently during deposition of the first metal oxide on the substrate, so that a stratified, wear-resistant composite ceramic coating comprising at least two two-phase metal oxide layers and at least one single-phase, continuous metal oxide layer, is formed. Intermittently pulsing the second metal halide gas produces a more stratified layer than merely pulsing the gas. FIG. 1 is an example of a stratified layer formed by intermittent pulsing, whereas continuous pulsing would produce a layer more closely resembling FIG. 2.

Preferably, the metal halide gases and the dopant are passed over the substrate at a temperature of from about 700° to 1250° C., and, preferably, at a pressure of from about 1 torr to ambient pressure. More preferably, the first metal halide gas, the second metal halide gas, the volatile oxidizing gas, the carrier gas, and the dopant, are passed over the substrate at a temperature of from about 950° C. to 1150° C.

In the process of the present invention, preferably a first halide gas is passed over a first metal so that the first metal halide gas is formed, which is passed over the substrate in a reactor. A second halide gas is passed over a second metal so that the second metal halide gas is formed within a separate, enclosable vessel. Preferably, the first metal is at least one member selected from the group consisting of aluminum and a salt of aluminum, and the second metal is at least one member selected from the group consisting of zirconium, a zirconium salt, yttrium, and a yttrium salt.

Alternatively, the process of the present invention further comprises forming the first metal halide gas by passing a first halide gas over a first metal comprising at least one member selected from the group consisting of aluminum, an aluminum salt, yttrium, a yttrium salt, zirconium, and a zirconium salt; and forming the second metal halide gas by passing a second halide gas over a second metal comprising at least one member selected from the group consisting of aluminum, an aluminum salt, yttrium, a yttrium salt, zirconium, and a zirconium salt; and forming a third metal halide gas by passing a third halide gas over a third metal comprising at least one member selected from the group consisting of aluminum, an aluminum salt, yttrium, a yttrium salt, zirconium, and a zirconium salt. The first, second, and third metals are different from one another. The first, second, and third metal halide gases are passed over the substrate at a temperature of from about 700° C. to 1250° C., and the discontinuous metal oxide phase comprises a discrete second phase of oxides of two metals selected from the group consisting of aluminum, yttrium, and zirconium. Preferably, the first metal is aluminum, and the continuous metal oxide phase comprises aluminum oxide.

Another aspect of the present invention pertains to a wear-resistant article, comprising a substrate and a wear-resistant composite ceramic coating. The substrate, and wear-resistant composite ceramic coating, are as described above in the process of the present invention. That is, the substrate comprises at least one member selected from the group consisting of cemented carbide and ceramic, and the composite ceramic coating comprises a two-phase metal oxide layer comprising a fully dense, adherent, continuous metal oxide phase and a fully dense, adherent, discontinuous metal oxide phase, as described above.

Preferably, the composite ceramic coating has a thickness of from about 0.1 to 30 microns, more preferably, from about 0.1 to 20 microns.

As with the process of the present invention, the wear-resistant article of the present invention optionally further comprises an intermediate layer between the substrate and the composite ceramic coating, as described above.

The continuous metal oxide phase is fully dense and adherent, and comprises a member selected from the group consisting of aluminum oxide, yttrium oxide, and zirconium oxide. Preferably, the continuous metal oxide phase comprises aluminum oxide. More preferably, the continuous metal oxide phase comprises aluminum oxide and the discontinuous phase comprises zirconium oxide. In this event, preferably the zirconium oxide particles comprise less that 50 volume percent, based on a total volume of the composite ceramic coating.

Alternatively, the continuous metal oxide phase may comprise zirconium oxide, while the discontinuous metal oxide phase comprises yttrium oxide; or, the continuous metal oxide phase comprises yttrium oxide and the discontinuous metal oxide phase comprises zirconium oxide.

The discontinuous metal oxide phase is fully dense and adherent, and comprises at least one member selected from the group consisting of aluminum oxide, yttrium oxide, and zirconium oxide, and the metal oxide or oxides constituting the discontinuous metal oxide phase is different from the metal oxide or oxides constituting in the continuous metal oxide phase. Preferably, the discontinuous metal oxide phase is substantially evenly dispersed within the continuous metal oxide phase. The second phase particles may be present as distinct equiaxed particles in the size range of $1 \times 10^{-7}$ to $1 \times 10^{-5}$ meters. The chemical vapor deposition method as described herein surprisingly also grows extremely fine particles or nanocrystals in the size range of $1 \times 10^{-10}$ to $1 \times 10^{-7}$ meters. The simultaneous existence of both sizes renders a unique bimodal size distribution previously unseen in chemically vapor deposited coatings. A schematic representation of this is illustrated in FIG. 3.

Furthermore, the continuous metal oxide phase may comprise aluminum oxide while the discontinuous metal oxide phase comprises both yttrium oxide and zirconium oxide. In this event, the discontinuous metal oxide phase may comprise a first discontinuous metal oxide phase comprising yttrium oxide, and a second discontinuous metal oxide phase comprising zirconium oxide, with the first and second discontinuous metal oxide phases being separate from one another.

Optionally, the composite ceramic coating may comprise a single-phase layer, comprising a first continuous metal oxide phase without a discontinuous phase therein, and thereover, a two-phase layer, comprising a second continuous metal oxide phase having a discontinuous metal oxide phase therein. In this event, preferably the substrate comprises tungsten carbide and cobalt, and preferably the continuous metal oxide phase comprises aluminum oxide, and preferably the discontinuous oxide phase comprises zirconium oxide dispersed in aluminum oxide, to form a two-phase aluminum oxide/zirconium oxide discontinuous metal oxide phase over the continuous aluminum oxide phase, and preferably this wear-resistant article further comprises an intermediate layer between the substrate and the composite ceramic coating. Preferably, the intermediate layer comprises TiC, the intermediate layer having a thickness of from about 2 to 5 microns. Preferably, the zirconium oxide particles comprise less that 50 volume percent, based on a total volume of the composite ceramic coating. The preferred amount of zirconium oxide is dependent on the functionality of the coating. As a second phase to reduce the crystallite growth of the aluminum oxide phase through renucleation, the zirconium oxide is preferably present at less than 10 volume percent. As a contributor to the chemical inertness and thermal transfer characteristics of the ceramic oxide coating, the zirconium oxide is preferably present in the range of 25 to 50 volume percent.

Finally, another aspect of the present invention pertains to a wear-resistant article, comprising a substrate and an evenly-distributed, wear-resistant composite ceramic coating deposited on said substrate by chemical vapor deposition, analogous to the article produced according to the process of the present invention, to result in a wear-resistant article according to the present invention.

It is an object of the present invention to provide a process for the high-speed deposition of an even, two-phase, extremely wear-resistant composite ceramic coating on a substrate, using chemical vapor deposition. The composite ceramic coating comprises a continuous metal oxide phase and a discontinuous metal oxide phase, deposited on the substrate in the presence of a dopant which increases the growth rate of the metal oxide layers, and which also permits deposition of thick, as well as thin, metal oxide coatings on the substrate. The process quickly produces a wear-resistant article which, by virtue of the presence of both the continuous and discontinuous metal oxide phases, exhibits very high abrasion and chemical wear resistance, under extreme conditions of use.

BRIEF DESCRIPTION OF THE DRAWINGS

The above and additional objects, characteristics, and advantages of the present invention will become apparent in the following detailed description of preferred embodiments, with reference to the accompanying drawings which are presented as non-limiting examples, in which.

DETAILED DESCRIPTION OF THE INVENTION

Figure 1:
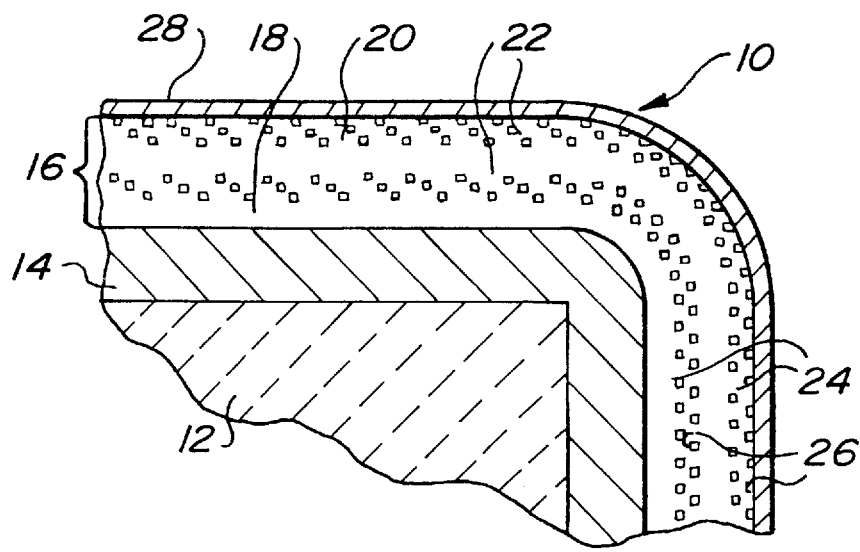
FIGS. 1, 2, and 3 illustrate an enlarged, detailed cross-sectional view of coated articles according to the present invention.

As used herein, the phrase "ceramic" is inclusive of metal oxides of aluminum, yttrium, and zirconium, among other compositions.

As used herein, the phrase "halide gas" refers to a gas comprising molecules comprising at least one halogen atom, but not comprising a metal atom. The phrase "metal halide gas" refers to a gas comprising molecules comprising both a metal atom and a halogen atom.

As used herein, the phrase "on the substrate" includes coatings positioned over the substrate, regardless of whether the coating is in direct contact with the substrate.

As used herein, the phrase "single-phase metal oxide layer" refers to a metal oxide layer comprising a continuous metal oxide phase, without the presence of a discontinuous metal oxide phase.

As used herein, the phrase "two-phase metal oxide layer" refers to a metal oxide layer comprising a continuous metal oxide phase, in which a discrete second phase of a discontinuous metal oxide phase is embedded. The phrase "two-phase metal oxide layer", as used herein, particularly refers to a composite layer comprising a fully dense, adherent, continuous metal oxide phase which serves as a matrix, within which is embedded one or more fully dense, adherent, discontinuous metal oxide phases which may be a single metal oxide, or more than one metal oxide, in the form of a discrete second phase. The discrete second phase may be oxides of a single metal or a solid solution of metal oxides of more than one metal, and each individual discrete particle may be of the one or more compounds, including one or more oxides of one or more metals, and different discrete second phases may have substantially different chemical compositions. The particles may be regularly shaped, as spheres, rods, whiskers, etc., or irregularly shaped.

As used herein, the phrase "composite ceramic coating" refers to a coating comprising at least a two-phase metal oxide layer, and which may further comprise a one-phase metal oxide layer.

The article according to the present invention may be prepared by deposition of an adherent, two or more phase composite ceramic coating on a metal carbide and/or ceramic substrate (preferably, a cemented metal carbide, e.g., WC—Co or a related material), wherein the composite ceramic coating comprises a continuous metal oxide phase, and a discontinuous metal oxide phase.

Various details of an article and process for the deposition of the two-phase metal oxide layer over a substrate are disclosed in U.S. Pat. No. 4,701,384, to SARIN et al., and U.S. Pat. No. 4,745,010, to SARIN et al., both of which are hereby incorporated by reference thereto, in their entireties.

Furthermore, various details of an article and process for the deposition of a doped metal oxide layer on a substrate are disclosed in U.S. Pat. No. 4,619,866, to SMITH, et al., which is hereby incorporated by reference thereto, in its entirety.

The deposition of the doped, two or more phase oxide-based composite ceramic coating, which is adherent to the substrate, wear-resistant, and resistant to chemical attack or breakdown at high temperatures, depends on careful control of process parameters during the deposition. The discontinuous oxide phase imparts greater wear-resistance to the coating, and can comprise a discontinuous, discrete second phase of $Al_2O_3$, $ZrO_2$, or $Y_2O_3$, or a combination of these, within a different continuous phase comprising $Al_2O_3$, $ZrO_2$, or $Y_2O_3$. Preferred coatings include discrete $ZrO_2$ particles and/or $Y_2O_3$ particles within a continuous $Al_2O_3$ phase, discrete $Y_2O_3$ particles within a continuous $ZrO_2$ phase, discrete $ZrO_2$ particles within a continuous $Y_2O_3$ phase, or discrete $Y_2O_3$ stabilized $ZrO_2$ particles, i.e., of a $Y_2O_3$—$ZrO_2$ solution, within a continuous $Al_2O_3$ phase.

The discrete second phase of the discontinuous metal oxide phase may be evenly distributed throughout the continuous metal oxide phase, or the distribution of the discrete second phase may be controlled to achieve, for example, a stratified structure having one or more layers each comprising a continuous metal oxide phase, without a discontinuous metal oxide phase therein, together with one or more layers each comprising a discontinuous metal oxide phase of the discrete second phase dispersed within a continuous metal oxide phase, preferably dispersed at controlled intervals throughout the continuous metal oxide phase. Similarly, the deposition may be controlled to deposit a first layer, comprising a continuous metal oxide phase of controlled depth and without a discontinuous metal oxide phase, together with a second layer of controlled depth over the first layer, the second layer comprising both a continuous metal oxide phase and a discontinuous metal oxide phase. The composition of the second phase may be controlled in a stratified layer so that a gradient concentration of the second phase is established in the coating.

The dopant, used in a controlled amount, comprise at least one member selected from the group consisting of sulfur, a compound of sulfur, selenium, a compound of selenium, tellurium, a compound of tellurium, phosphorus, a compound of phosphorus, arsenic, a compound of arsenic, antimony, a compound of antimony, bismuth, and a compound of bismuth. Examples of dopant compounds of sulfur are $H_2S$, $CS_2$ and COS. Examples of dopants of selenium are $SeCl_4$, $Se_2Cl_2$ and $H_2Se$. Examples of dopants of tellurium are $TeCl_2$, $TeCl_4$, and $H_2Te$. Examples of dopants of phosphorus are $PCl_3$ and $PH_3$. Examples of dopants of arsenic are $AsCl_3$ and $AsH_3$. Examples of dopants of antimony are $SbCl_3$, $SbH_3$ and $SbCl_5$. Examples of dopants of bismuth are $BiCl_4$ and $BiCl_3$. Preferably, the dopant comprises sulfur or phosphorus, or a compound or compounds containing sulfur or phosphorus, such as $H_2S$ or $PCl_3$. Although the article and process of the present invention are described below with reference to sulfur or phosphorus dopants (unless otherwise indicated), it is to be understood that the present invention is equally applicable to one or more members selected from the group consisting of selenium, tellurium, arsenic, antimony, and bismuth, as the dopant. Preferably, the dopant is present in an amount sufficient to achieve a substantially even distribution of the metal oxide phases on the substrate.

A suitable form for supplying the dopant is a gas having molecules containing one or more of the elements disclosed above as suitable dopants. According to the present invention, sulfur, phosphorus, and/or corresponding elements are generally introduced in the process in compound form. However, in order that the effects encompassed by the invention be realized, it is important that the compound used for the supply of sulfur or phosphorus is not only of adequate purity, but also free from elements which have a detrimental effect upon the process itself, or on the product made by the process. The sulfur or phosphorus containing component (or components) participating in the process should therefore be of such a composition that it does not contain any foreign elements which are harmful to the process. As known in the art of chemical vapor deposition, silicon is considered to be a harmful element. Other elements or compounds which would also interfere with the process of the present invention should also be avoided. Hydrogen sulfide ($H_2S$) and phosphorus chloride ($PCl_3$) are examples of compounds which permit a carefully controlled and optimized introduction of the dopant into one or more of the various gases used in the process. Carbonoxysulfide (COS) or phosphine ($PH_3$) can also be used.

The preferred process for preparing the articles according to the invention involves the use of a mixture of gases including a mixture of metal halides and other reactant gases under carefully controlled conditions to deposit respective metal oxides onto the substrate, via chemical vapor deposition (CVD). Alternatively, as is known to those of skill in the art, the article of the present invention can also be produced by an appropriate physical vapor deposition (PACVD) process. Descriptions of CVD and PACVD processes are prevalent in the literature. A document which describes the CVD process in some detail is: K. G. Gunther, H. Freller, H. E. Hintermann and W. Konig, "Advanced Coatings by Vapor Phase Processes", Annals of the CIRP, Vol 38, 2, 1989, pp.645–655. A document which discloses PACVD in some detail is U. König, R. Tabersky and H. Van den Berg, "Research, Development and Performance of Cemented Carbide Tools Coated by Plasma-Activated Chemical Vapor Deposition," Surface and Coatings Technology, 50 (1991) 57–62.

The process of the present invention is preferably carried out by passing over the substrate a first gaseous mixture comprising a first metal halide gas comprising a member selected from the group consisting of the halides of aluminum, yttrium, and zirconium, and a second metal halide gas comprising a different member selected from the group consisting of the halides of aluminum, yttrium, and zirconium. Preferably, each of the metal halide gases further comprises an oxidizing gas, such as water vapor, and a carrier gas, such as argon. Preferably, the temperature is from about 900° C. to 1250° C., and the pressure from about 1 torr to ambient pressure. The partial pressure ratios, the flow rate, and the deposition time are sufficient to deposit, on the substrate, a continuous, fully dense, adherent, wear-resistant composite ceramic coating having a thickness of from about 0.1 to 30 microns. The coating comprises at least two members selected from the group consisting of the oxides of aluminum, yttrium, and zirconium. While the first metal halide gas is supplied at a partial pressure selected to deposit a continuous metal oxide phase, the second halide gas is supplied at a partial pressure selected to deposit at least one discontinuous metal oxide phase, dispersed as a discrete second phase within the continuous metal oxide phase, to form an especially wear-resistant composite ceramic coating on the substrate. In order to achieve a two-phase metal oxide layer containing the discrete second phase of the discontinuous metal oxide phase within the continuous metal oxide phase, it is important to control the deposition by controlling such parameters as gas flow rates, to produce the desired deposition of the continuous metal oxide phase and the discontinuous metal oxide phase.

The metal halides preferably are produced by passing a halide gas, or gases, over the metals, for example metal particulates in the form of grains or chips. The metals may be separated, or may be combined as a mixture of metals, as a metal alloy, or as metal salts. A single halide gas can be passed over the combined metals to form a mixture of metal halides. Alternatively, the metal forming the continuous metal oxide phase is separate, and separate halide gas streams are passed over the metals to form separate metal halides, which are later combined, i.e., mixed together in the vapor state, during deposition of the two-phase oxide layer. Furthermore, carrier gases, such as argon, may be combined with the halide gases. Preferred halide gases are $Cl_2$ and HCl, forming with the metals described above $AlCl_3$, $ZrCl_4$, and/or $YCl_3$. These are combined with suitable other gases such as $H_2$ and $CO_2$ or other volatile oxidizing gases such as $H_2O$.

One or more of the metals may be advantageously contained in a separate vessel within a reactor in which the chemical vapor deposition is carried out. The halide gases enter the reactor from a separate vessel, after which the halide gases are converted to the respective metal halide gases by being passed over the respective particulate metal contained in the reactor. The metal halide gases then react with the oxidizing gas during deposition on the substrate in the reactor. This method presents the advantage of utilizing the temperature gradient within the reactor, which can be accurately controlled in a multiple zone furnace or by way of location within the reactor, to control the temperature of the halide-metal reaction, as well as the temperature of the reaction of the metal halide with the oxidizing gas during the deposition. Thus, different metals in separate vessels may be disposed at different zones or positions within the reactor to control the reaction temperature for each, and likewise for the oxidation of the metal halide gas by controlling the position of the substrate in the reactor.

In a preferred process according to the invention, the second metal halide gas is mixed with the first metal halide gas intermittently, during the deposition of a continuous metal oxide layer, by pulsing the second metal halide gas into the first metal halide gas, and mixing therewith. Most preferably, a first metal oxide layer, comprising a continuous metal oxide phase without a discontinuous metal oxide phase therein, is deposited before deposition of the discontinuous oxide phase is initiated by the pulsing of the second metal halide gas into the reactor, in order to form a stratified composite ceramic coating in which one or more layers, comprising a continuous metal oxide phase without a discontinuous metal oxide phase therein, alternates with one or more layers comprising a continuous oxide phase having a discontinuous oxide phase therein.

The pulsing of the second halide gas, i.e, the halide gas which reacts with the metal to form the second metal halide gas, is preferably carried out while maintaining continuous flow of the first halide gas over the first metal, to form the first metal halide gas, i.e., the gas forming the continuous oxide phase or phases. The second halide gas is pulsed over the second metal at intervals and for times selected to control the size and distribution of the discrete second phase of the discontinuous oxide. Furthermore, the pulsing method may be started and stopped in a manner to control the distribution of the discontinuous metal oxide phase within the continuous metal oxide phase, for example, to achieve either an even distribution or a stratified distribution, as described above. The pulsing of the second halide gas over the second metal pulses the second metal halide gas into the reactor, and hence, over the substrate. Of course, the first metal halide gas may be allowed to flow, without the second metal halide gas, for a period of time sufficient to deposit the continuous oxide phase without the simultaneous deposition of a discontinuous metal oxide phase, as described above.

The process according to another preferred embodiment of the invention involves passing a halide vapor such as $Cl_2$ or HCl, optionally mixed with a carrier gas, over a mixture or alloy of two or more metals selected from the group consisting of aluminum, yttrium, and zirconium, and their metal salts, at from about 250° C. to 1250° C., to form a first gaseous mixture comprising halide gases of two or more of aluminum, yttrium, and zirconium, and optionally the carrier gas. The metal salts are hydroxides such as $Al(OH)_3$, $AlO(OH)_3$, $Y(OH)_3$ and $Zr(OH)_4$, which react with a halide, such as HCl, to form a metal halide and water. This first gaseous mixture is mixed with other reactant gases to form a second gaseous mixture. The second gaseous mixture is passed over the substrate at a temperature of from about 900° C. to 1250° C., at a pressure of from about 1 torr to ambient pressure, thereby depositing a composite ceramic layer on the substrate. The selection of the reactant gases (i.e., the metal halide gases and the oxidizing gas), the flow rates of all of the gases, the surface areas, and the ratio of the surface areas, of the two or more metals, and the deposition time, is carried out so that the composite layer comprises an adherent layer of from about 0.1 to 30 microns thick, of a continuous metal oxide phase comprising a metal oxide of one of the metal halide gases disclosed above, and one or more discontinuous metal oxide phases of the one or more other metal halide gases disclosed above. The discontinuous metal oxide phase or phases are dispersed as a discrete second phase within the continuous metal oxide phase.

Of course, in order to deposit the metal oxide phases on the substrate, the oxidizing gas must be present and in admixture with the metal halide gases during the deposition of the metal oxides onto the substrate. Furthermore, in order to be effective, the dopant must also be present with the metal halide gases during the deposition of the metal oxides onto the substrate in the reactor.

Another preferred process according to the invention involves passing a first halide gas, optionally mixed with a first carrier gas, over a first metal comprising a member selected from the group consisting of aluminum, yttrium, and zirconium, and metal salts thereof, at from about 250° C. to 1250° C., to form a first metal halide gas. A second halide gas is passed over, at a temperature of from about 250° C. to 1250° C., and at a pressure of from about 1 torr to ambient pressure, one or more additional metals selected from the group consisting of aluminum, yttrium, and zirconium, and alloys and metal salts thereof. The first and second halide gases may be the same or different, and, optionally, either or both can be mixed with a second carrier gas, which may be the same or different from the first carrier gas. However, the respective first and second metals, to which the respective first and second halide gases are exposed, are different metals. The resulting first and second metal halide gases, optionally with the first and second carrier gases and other reactant gases, are passed over the substrate at a temperature of from about 900° C. to 1250° C., and at a pressure of from about 1 torr to ambient pressure, thereby depositing a composite ceramic layer on the substrate. The reactant gases (e.g., the oxidizing gas), the flow rates of all of the gases, the surface areas, and the ratio of the surface areas, of the two or more metals, and the deposition time, are selected so that the composite layer comprises an adherent layer of from about 0.1 to 30 microns thick, of a continuous oxide phase comprising a metal oxide of one of the metal halide gases, and one or more discontinuous oxide phases of the one or more other metal halide gases. The discontinuous metal oxide phase or phases are dispersed as a discrete second phase with the continuous metal oxide phase. This preferred method allows for deposition of a plurality of metal oxide layers of differing composition, i.e., with some layers lacking the discontinuous metal oxide phase, by merely discontinuing the flow of the second halide gas during deposition of the first metal halide onto the substrate.

In the most preferred embodiment of the process according to the present invention, the gases are passed over the substrate within the confines of a reactor. Furthermore, the second metal, which is used to form the second metal halide gas and the discontinuous metal oxide phase, is disposed within a separate enclosable vessel within the reactor. The separate vessel operationally communicates with a source of the respective gaseous halide to be used, and optionally also with the respective carrier gas, and with the reactor, so that the respective second halide gas enters the separate vessel, passes over the surfaces of the metal or metals therein, to form the respective metal halide gas, which flows into the reactor and passes over the substrate as a component of the gaseous mixture.

Some examples of composite coatings on the wear-resistant article according to the present invention include: $Al_2O_3$ continuous metal oxide phase/$ZrO_2$ discontinuous metal oxide phase; $ZrO_2$ continuous metal oxide phase/$Y_2O_3$ discontinuous metal oxide phase; $Y_2O_3$ continuous metal oxide phase/$ZrO_2$ discontinuous metal oxide phase; $Al_2O_3$ continuous metal oxide phase/$Y_2O_3$ stabilized $ZrO_2$ discontinuous metal oxide phase; $Al_2O_3$ continuous metal oxide phase/$Y_2O_3$ discontinuous metal oxide phase; and, $Al_2O_3$ continuous metal oxide phase/$ZrO_2$ and $Y_2O_3$ discontinuous metal oxide phase.

The continuous and discontinuous metal oxide phases according to the present invention are extremely wear-resistant, and are fully dense and adherent, and make it possible to combine the wear-resistant properties of two or more components without the problems associated with differences in expansion coefficients and adhesion presented by layering of continuous coatings of the materials.

Furthermore, the presence of the dopant in the continuous metal oxide phase and/or the discontinuous metal oxide phase, and during the deposition of the continuous metal oxide phase and/or the discontinuous metal oxide phase, produces a substantial increase in the growth rate of the deposited metal oxide phases, and in a manner so that a uniformly thick wear-resistant surface layer, i.e., coating, is evenly distributed on the substrate. The increase in the rate of deposition of the metal oxide phases deposits the metal oxides more rapidly, thereby increasing the quality of the coating in that, for any given coating thickness, the period of time during which coating and substrate are treated at a high temperature is reduced, thereby reducing the probability of detrimental changes in the structure and composition of the continuous and discontinuous metal oxide phases, the intermediate layer (if present), and the substrate, which may occur as a result of prolonged exposure to higher temperatures.

Depending upon the amount of dopant, e.g., sulfur or phosphorus, added to the gases used in the process of the present invention, the growth rate of the metal oxide phases can be made to occur at at least about 1–2 micrometers per hour, per volume percent dopant (e.g., $H_2S$, in a concentration of from about 0.01 to 0.2 volume percent $H_2S$), which substantially exceeds the up to 0.5 micrometer per hour growth rate typical for coatings produced without the addition of the dopant.

The resulting coating produced according to the present invention provides the wear-resistant article of the present invention with mechanical, physical, and chemical properties which are capable of producing a performance which exceeds the performance of products manufactured by other chemical vapor deposition processes, but which do not utilize both the continuous and discontinuous metal oxide phases, at least one of which comprises the dopant. The performance of the article of the present invention can be observed quite easily in the area of cutting and wear performance. In instances in which excessive coating thicknesses around edges and corners are disadvantageous, an improved performance is obtained for the wear-resistant article of the present invention.

Furthermore, the use and presence of the dopant in the present invention makes it possible to produce wear-resistant articles having ceramic oxide, preferably aluminum oxide, coating of uniform thickness around the substrate, and with, among other features, thicknesses in ranges of interest in cutting applications. The coatings pertaining to the invention can be applied to previously coated as well as uncoated substrates, e.g., substrates containing at least one carbide in addition to the binder metals.

Furthermore, the use and presence of the dopant permits deposition of a relatively thick two-phase metal oxide layer, i.e., thicker than if the dopant is not used or present. Such thicker coatings increase the amount of wear-resistant coating, thereby increasing the useful life of the cutting insert of the present invention.

Further improvement in the adhesion of the coating to the substrate may be achieved by depositing, between the composite ceramic coating and the substrate, at least one thin intermediate layer, preferably having a thickness of from about 0.1 to 15 microns; more preferably, from about 1 to 8 microns, still more preferably; from about 2 to 5 microns. Preferably, the intermediate layer comprises at least one member selected from the group consisting of carbides, nitrides, carbonitrides, oxides, and borides, of at least one member selected from the group consisting of titanium, zirconium, hafnium, vanadium, niobium, tantalum, chromium, molybdenum, tungsten, and silicon. $TiB_2$, $ZrB_2$, etc. are exemplary of borides suitable for use in cutting tools. Preferably, the intermediate layer comprises at least one member selected from the group consisting of titanium carbide, titanium nitride, and titanium carbonitride. Such deposition may be achieved in known manner as a preliminary part of the same coating process, or in a separate, prior coating process. Similarly, for special applications, for example friction, cosmetic, wear, and thermal purposes, a thin outer layer such as TiN may be applied in known manner over the composite coating.

When higher amounts of dopant, e.g., sulfur or phosphorus, are added, that is, amounts of from about 0.05 to 1 volume percent $PCl_3$, intermediate layers are obtained if a cemented carbide substrate is present. This type of intermediate layer is beneath and/or within the two-phase metal oxide layer. This intermediate layer contains the dopant, e.g., sulfur or phosphorus, as well as metal diffused from the substrate, i.e., the binder phase of the cemented carbide substrate. Such an intermediate layer can consist of $Co_2P$ or $Co_2S$. In general, the thickness of this intermediate layer is from about 0.3 to 3 microns. The dopant, e.g., sulfur or phosphorus, may also occasionally diffuse into the cemented carbide substrate. Furthermore, when phosphorus is used as the dopant, the two-phase metal oxide layer can be enriched in metal diffused from the binder phase of the substrate, e.g., cobalt. Similar effects can be obtained with the other dopants, particularly those of the phosphorus group (P, As, Sb, and Bi).

The substrate to be used in the present invention is preferably a hard material (together with a binder material where applicable), and preferably comprises at least one member selected from the group consisting of ceramic and cemented carbide. A substrate comprising a cemented carbide preferably has a surface region enriched with respect to the so-called gamma phase, for instances in which additional layers are to be added on to the two-phase metal oxide coating produced according to the invention. A chemical vapor deposition process carried out according to the present invention can be performed in a step separate from the deposition of other layers being deposited, but is preferably carried out successively, and in the same apparatus, so that a well-defined surface is available for each deposition step.

In general, the two-phase metal oxide layer, which may consist of a single layer having a substantially even dispersion of the discontinuous phase therein, or alternatively may consist of a plurality of metal oxide layers of differing composition, may have a thickness of from about 0.1 to 30 microns. Preferably, the two-phase metal oxide layer has a thickness of from about 0.1 to 20 microns, and more preferably, has a thickness of from about 0.3 to 9 microns. Those skilled in the art recognize that the preferred thickness will depend upon the application and product.

Figure 2:
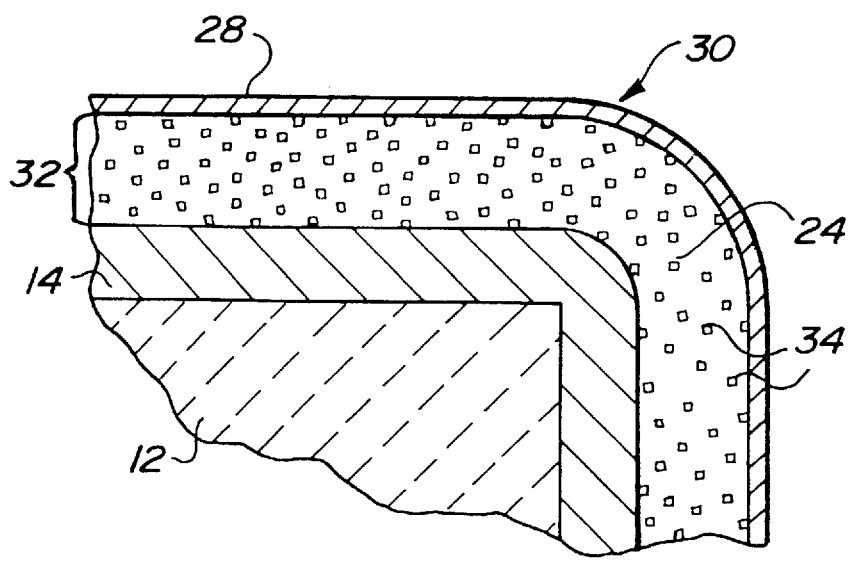
Figure 3:
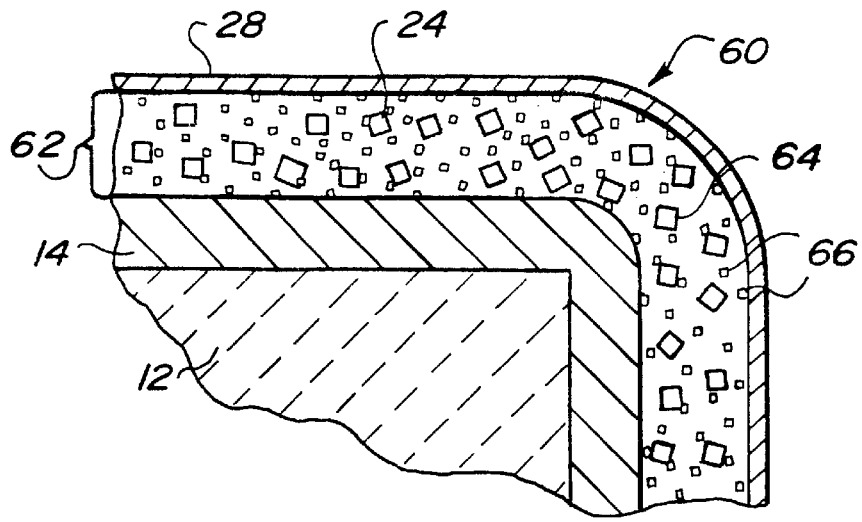
Figure 4:
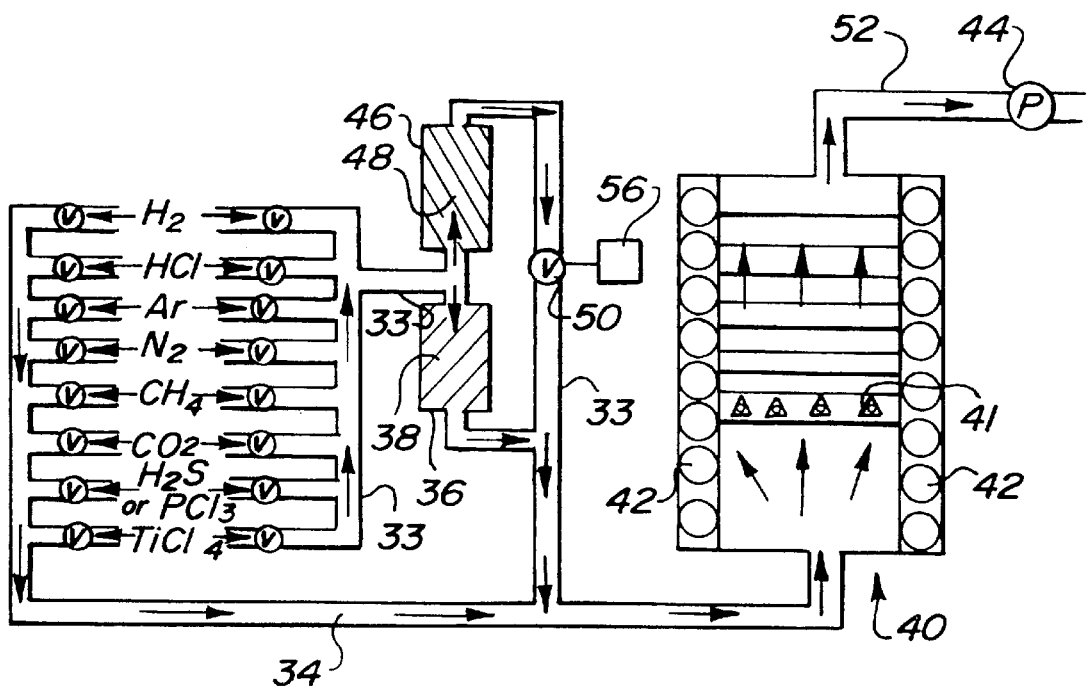
FIG. 4 is a schematic of an apparatus and process for depositing a doped, two-phase metal oxide layer on a substrate.
Figure 5:
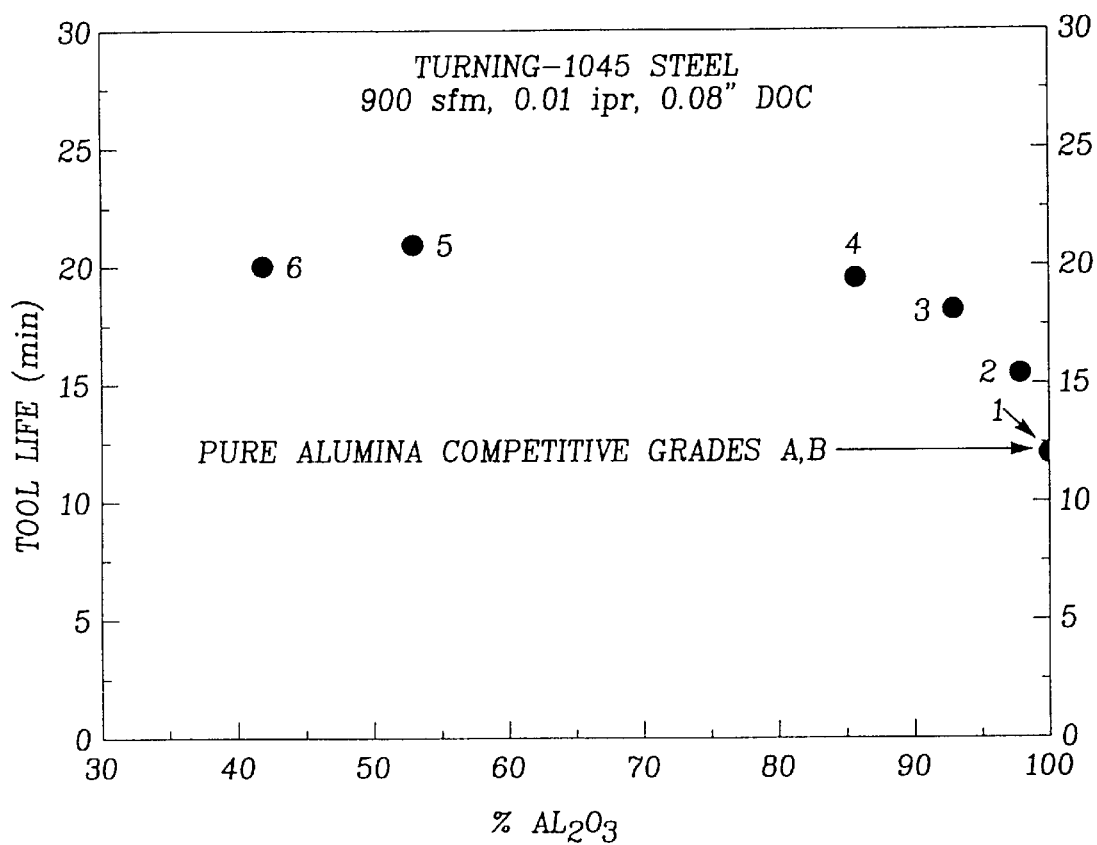
FIG. 5 provides tool life results of composite samples in comparison with pure alumina.

Describing now the drawings, it is to be understood that enough of the construction of the article and process of the present invention has been depicted therein, as is needed by those skilled in the art to readily understand the underlying principles and concepts of the present invention. FIGS. 1, 2, and 3 are directed to the wear-resistant article of the present invention, whereas FIG. 4 is directed to the process of the present invention, as well as a schematic view of the process of the present invention, and FIG. 5 provides a graphic presentation of tool life data as a function of percent $Al_2O_3$.

FIGS. 1, 2, and 3, not drawn to scale, schematically illustrate an enlarged, detailed cross-sectional view of typical coated articles 10, 30 and 60, respectively, according to the present invention. As shown in FIG. 1, substrate 12, a shaped cemented WC material, may be a cutting tool or other article requiring wear resistance under extreme conditions. Thin layer 14 of TiC covers the substrate, at least in the area subjected to wear. Composite layer 16 is deposited over TiC layer 14, and is made up of one-phase metal oxide layers 18 and 20 of $Al_2O_3$, and two-phase metal oxide layers 22 comprising continuous metal oxide phase of $Al_2O_3$ 24 and discontinuous $ZrO_2$ phase 26. As shown in FIG. 1, there is no separation between the continuous $Al_2O_3$ phase 24 of two-phase portions 22 and the continuous $Al_2O_3$ phase 24 of one-phase portions 18 and 20. The $Al_2O_3$ of the composite coating is a single continuous phase having a second phase of controlled composition and distribution dispersed therein. Outer layer 28 of TiN is deposited over the composite layer, giving article 10 a distinctive identifying color.

FIG. 2 illustrates an alternate embodiment of the article according to the invention. Like features in the two figures are identified by the same reference numerals. In FIG. 2, substrate 12 is overlaid with thin TiC layer 14 in the same manner as shown in FIG. 1. Two-phase metal oxide layer 32 is deposited over TiC layer 14, and is made up of continuous $Al_2O_3$ phase 24 with a discontinuous phase particles 34 comprising $Y_2O_3$ stabilized $ZrO_2$ evenly distributed throughout continuous $Al_2O_3$ phase 24. Outer layer 28 of TiN is deposited over two-phase metal oxide layer 32.

FIG. 3 illustrates an alternative embodiment of a coated article 60 according to the invention. Like features with FIG. 1 and FIG. 2 are identified by the same reference numerals. In FIG. 3, substrate 12 is overlaid with a thin TiC layer 14 in the same manner as shown in FIG. 1 and FIG. 2. Composite layer 62 is deposited over TiC layer 14 and is made up of continuous aluminum oxide phase 24, with second phase particles 64 and 66 of bimodal size distribution. Both are evenly distributed throughout continuous phase 24. Outer layer 28 of TiN is deposited over the two-phase metal oxide layer 62.

FIG. 4 provides a schematic illustration of an apparatus suitable for carrying out a process according to the present invention. Sources of various gases include: $H_2$ and HCl, which serve as the halide gas; $CO_2$, which reacts with $H_2$ to form $H_2O$, which serves as the oxidizing gas; Ar, which is optional and serves as the carrier gas; and $H_2S$ or $PCl_3$, which serves as the dopant. Individual valves ("V") on a first manifold permit certain of these gases to be supplied to first conduit 33, and likewise, individual valves on a second manifold permit any combination of these gases to be supplied to second conduit 34.

The gas mixture flowing through first conduit 33, i.e., preferably comprising first halide gas, and the carrier gas, is directed into halogenation reactor 36 by a portion of first conduit 33. A portion of the first halide gas also exits a downstream end of first conduit 33, and passes over first metal 38, present in the form of particulates, i.e., grains or chips, having a relatively high surface area. First metal 38 is constantly open to the internal atmosphere within reactor chamber 40. The first halide gas reacts with the first metal, resulting in the formation of the first metal halide gas, which flows outwardly from first metal 38, and into reactor chamber 40, and therein reacts with the oxidizing gas during deposition of the metal oxide on and/or over substrate 41.

The second halide gas exits a downstream end of separate chamber 46 first conduit 33, and passes over second metal 48, present in the form of particulates, i.e., grains or chips, having a relatively high surface area. Preferably, second metal 48 is pulsed into chamber 40, via a pulsing valve 50, which is repeatedly opened and shut by pulsing mechanism 56, constructed in a manner known to those of skill in the art. The second halide gas reacts with second metal 48, resulting in the formation of the second metal halide gas, which flows outwardly from the downstream end of separate chamber 46, and into reactor chamber 40, and therein reacts with the oxidizing gas during deposition of the second metal oxide on and/or over substrate 41.

The other reactive and carrier gases are fed into reactor 40 via second conduit 34, which meets with first conduit 33 at the base of the reactor.

The atmosphere within the reactor, including all gases injected into the reactor, and substrate 41, are heated by resistance heater 42. Gas flow is maintained within reactor chamber 40 via pump 44 on exhaust conduit 52. Optionally, exhaust conduit 52 may also be equipped with a valve and cold trap (not illustrated).

Alternatively, but less preferably, either or both of the first halide gas and second halide gas may be formed in a heated halogenation reactor chamber located within reactor chamber 40, as is disclosed in U.S. Pat. No. 4,745,010, which is hereby incorporated by reference thereto, in its entirety.

Furthermore, the apparatus for carrying out the process of the present invention can also contain one or more systems for purifying the various gases, and mixtures of gases, such gas purification systems being constructed and operated in a manner as known to those of skill in the art.

The metal halide can be produced in the form of a gas, either by evaporation of the metal halide in the solid or liquid phase, or by reacting the metal with the halogen. Water vapor can be added to the metal halide gas either by evaporation of water or, preferably, by reacting hydrogen with carbon dioxide. The dopant, e.g. sulfur, phosphorus or compounds thereof, can be added to the metal halide gas by adding the dopant as a gas, or a mixture of gases. Preferably, the addition of the dopant is made in the form of hydrogen sulfide ($H_2S$) or phosphorus chloride ($PCl_3$), which is introduced throughout the whole process, or merely part of the process. Sulfur, phosphorus or their compounds may also be generated in situ, in halogenation reactor 38, or deposition reactor 40.

Any one or more of the oxidizing gas, the dopant gas, and the carrier gas, can be added to the halide gas prior to exposure to the respective metal, or can be added directly to the reactor chamber. However, it is preferred to combine the oxidizing gas, dopant and any carrier gases with the metal halide or metal halides and associated carrier gas or gases within the reaction chamber. In this way the gases can be mixed and heated simultaneously.

The substrate to be coated can be heated either directly, or by means of induction heating, or indirectly by heating, for example, by supporting plates or by the reactor itself by, for example, resistance heater 42. In general, the temperature within the reactor chamber is from about 700° C. to about 1250° C., preferably, from about 900° C. to 1250° C., and still more preferably, from about 950° C. to 1150° C. In general, the pressure within the reactor chamber is from about 1 torr to ambient pressure; preferably, from about 10 torr to 300 torr; and most preferably, from about 50 torr to 200 torr.

The concentrations of the first and second metal halide gases in the gaseous mixture of reactants should preferably be over stoichiometric with respect to the water vapor. In general, the concentration of the dopant-containing gas should be present in an amount of from about 0.003 to 1 volume percent per atom of S, Se, Te, P, As, Sb and/or Bi in the gas molecule, based on the total gas volume being brought into the reactor. Preferably, the dopant-containing gas is present in an amount of from about 0.02 to 0.3 volume percent per atom of S, Se, Te, P, As, Sb and/or Bi in the gas molecule, based on the total gas volume being brought into the reactor. Preferably, the dopant is present during the deposition of both the continuous metal oxide phase, as well as during the deposition of the discontinuous metal oxide phase(s).

It is also important to carefully monitor the concentration of carbon dioxide. The amount of the dopant-containing gas recommended above refers to the case of roughly stoichiometric proportions of carbon dioxide and aluminum chloride in the gas entering the reactor at a temperature of 1000° C. and about 100 torr. In general, the total pressure of the gaseous phase is in a range of from about 1 torr to 760 torr; preferably, from about 50 to 200 torr.

It is often easy to demonstrate the presence of sulfur or phosphorus in a coating or in adjacent parts of the substrate, including any intermediate layer, by means of microphobe analysis. More sophisticated methods of analysis, e.g., ion-microprobe, proton induced x-ray emission spectroscopy, or auger analysis, can be used to detect even extremely small amounts of sulfur or phosphorus, or effects caused by their presence. Excellent performance can be observed when the coating and/or the surface of the substrate contain minor amounts, e.g., more than 0.1 weight percent, of sulfur, selenium, tellurium, phosphorus, arsenic, antimony and/or bismuth. It will be understood that significant amounts of the dopant element(s) need not be present, and could adversely affect the use of the coated bodies in certain applications, i.e., wear-resistant cutting inserts.

The following Examples are presented to enable those skilled in this art to more clearly understand and practice the present invention. These Examples should not be considered as a limitation upon the scope of the invention, but merely as being illustrative and representative thereof.

EXAMPLES 1–6

After rinsing of all gas lines with their respective gases for 0.5 to 1 hour, samples of cutting tool inserts of a cemented carbide material, steel cutting grade C-5, are coated with a layer of TiC about 3 microns thick, by a known technique in a chemical vapor deposition reactor. An excess of pre-weighed zirconium metal chips are placed in a closed vessel, such as chamber 46 in FIG. 4. An excess of aluminum chips are placed in another vessel, such as reactor 36 in FIG. 4. The reactor is evacuated to about 10 torr, then heated under low pressure, while being flushed with flowing hydrogen, to increase the outgassing before deposition. Following the deposition procedure, the reactor is cooled, at the deposition pressure and while being flushed with hydrogen, to about 300° C., then under ambient pressure and flowing nitrogen to room temperature.

The deposition reaction conditions for Examples 1–6 are given in Table 1, below. For all of these Examples, the halide gas is HCl, the dopant gas is $H_2S$, the carrier gas for the Al and Zr reactions is Ar, and the other reactant gas is $CO_2$, with $H_2$ as a carrier. The HCl flow rates are adjusted to give the metal chloride flow rates shown in Table 1. The deposition pressure for Examples 1–6 is 100 torr; the temperature, 1000° C. For each of these Examples, a period of single-phase $Al_2O_3$ deposition (in the presence of dopant) ranging from 0.5 to 2.5 hours, is carried out before the two-phase $Al_2O_3/ZrO_2$ deposition is initiated, also in the presence of the dopant. During the single-phase deposition, Ar gas is allowed to flow over the Zr, but the HCl gas flow is shut off with respect to flow over Zr.

TABLE 1

| Ex. | Deposition | Flow Rate, ccpm Total | $H_2$ vol. % | $CO_2$ vol. % | $AlCl_3$ vol. % | $ZrCl_4$ vol. % | $H_2S$ vol. % | Time hrs. | Temp °C. | Pressure |
|---|---|---|---|---|---|---|---|---|---|---|
| 1 | $Al_2O_3$ $Al_2O_3/ZrO_2$ | 5000 | 95 | 4 | 0.8 | 0 | 0.2 | 5.4 | 990 | 100 |
| 2 | $Al_2O_3$ $Al_2O_3/ZrO_2$ | 5000 | 95 | 4 | 0.6 | 0.2 | 0.2 | 4.5 | 970 | 100 |
| 3 | $Al_2O_3$ $Al_2O_3/ZrO_2$ | 5000 | 73 | 26 | 0.6 | 0.2 | 0.2 | 3.9 | 990 | 100 |
| 4 | $Al_2O_3$ $Al_2O_3/ZrO_2$ | 5000 | 95 | 4 | 0.6 | 0.2 | 0.2 | 4.5 | 970 | 150 |
| 5 | $Al_2O_3$ $Al_2O_3/ZrO_2$ | 5000 | 95 | 4 | 0.6 | 0.2 | 0.2 | 3.9 | 990 | 100 |
| 6 | $Al_2O_3$ $Al_2O_3/ZrO_2$ | 5000 | 95 | 4 | 0.6 | 0.2 | 0.2 | 3.4 | 990 | 150 |

The results of Examples 1–6 are shown in Table 2. The thickness of the coatings is measured by cross sectional optical and electron microscopy. The chemical composition of the coating is determined by x-ray fluorescence analysis.

The coating is deposited on the TiC underlayer as a continuous alumina/zirconia layer over a single-phase alumina portion, similar to the article illustrated in FIG. 2, but without the TiN layer over the oxide coating. The oxide coating and the TiC underlayer show satisfactory thickness and good adherence.

TABLE 2

| Example | Oxides thickness, microns | X-Ray % $Al_2O_3$ | Fluorescence % $ZrO_2$ |
|---|---|---|---|
| 1 | 3.0 | 100 | 0 |
| 2 | 3.0 | 96 | 4 |
| 3 | 3.0 | 93 | 7 |
| 4 | 3.0 | 86 | 14 |
| 5 | 3.0 | 53 | 47 |
| 6 | 3.0 | 42 | 58 |

Machining tests are performed on the coated cutting tool inserts samples of Example 1–6 and, for comparison on two different commercial grades of TiC based inserts coated with $Al_2O_3$ (A and B).

Inserts 1–6 and A and B are tested by turning a 1045 steel workpiece under dry conditions at 900 sfm, 0.015 ipr, 0.08 in DOC. The results are illustrated in FIG. 5, showing the tool life for each type of insert. The inserts coated by the method according to the invention compare favorably with the materials in current commercial use.

EXAMPLES 7 and 8

The process of Examples 1–6 is repeated for Examples 7 and 8, to coat the same type of TiC coated cemented carbide cutting tool inserts, except that $ZrCl_4$ is pulsed intermittently during the deposition period. The deposition pressure and temperature are 100 torr and 1000° C., respectively. The remaining reaction conditions are given in Table 3 below. The resulting composite coatings are similar to that illustrated in FIG. 1, except that no TiN layer is deposited over the oxide coating. No single phase portion is deposited below the two-phase portion of the oxide layer.

TABLE 3

| | Flow Rate ccpm | Volume percents | | | | | Time |
|---|---|---|---|---|---|---|---|
| Ex. | Total | $H_2$ | $CO_2$ | $AlCl_2$ | $ZrCl_4$ | $H_2S$ | hrs. |
| 7 | 5000 | 95 | 4 | 0.6 | 0.2 | 0.2 | 4.5 |
| 8 | 5000 | 73 | 26 | 0.6 | 0.2 | 0.2 | 4.5 |

Finally, although the invention has been described with reference of particular means, materials and embodiments, it is to be understood that the invention is not limited to the particulars disclosed and extends to all equivalents within the scope of the claims.

What is claimed is:

1. A process for depositing a wear-resistant composite ceramic coating on a substrate composed of at lest one member selected from the group consisting of cemented carbide and ceramic, the process comprising:

passing a first metal halide gas, a second metal halide gas, a volatile oxidizing gas, a carrier gas, and dopant over the substrate at a temperature of from about 900° to 1250° C., and at a pressure of from about 1 torr to ambient pressure, so that a two-phase, wear-resistant composite ceramic coating is deposited on said substrate, said composite ceramic coating comprising a two-phase metal oxide layer comprising a fully dense, adherent, continuous metal oxide phase and a fully dense, adherent, discontinuous metal oxide phase, wherein:

said first metal halide gas comprises a member selected from the group consisting of aluminum halide and zirconium halide, said first halide gas being passed over said substrate at a partial pressure, flow rate, and substrate exposure time, to deposit on the substrate and form said continuous metal oxide phase comprising a metal oxide of said first metal halide gas;

said second metal halide gas comprises a member selected from the group consisting of aluminum halide and zirconium halide, said second metal halide gas being different from said first metal halide gas, said second metal halide gas being mixed with said first metal halide gas, said second metal halide gas being passed over said substrate at a partial pressure, flow rate, and substrate exposure time, to deposit over the substrate and form a discontinuous metal oxide phase comprising a metal oxide of said second metal halide gas, said discontinuous metal oxide phase being dispersed as a discrete second phase within said continuous metal oxide phase; and said dopant comprises at least one member selected from the group consisting of sulfur and a compound of sulfur.

2. The process according to claim 1, further comprising depositing an intermediate layer between the substrate and the wear-resistant composite ceramic coating, said intermediate layer having a thickness of from about 0.5 to 10 microns, and comprising at least one member selected from the group consisting of carbides, nitrides, carbonitrides, oxides, and borides, of at least one member selected from the group consisting of titanium, zirconium, hafnium, vanadium, niobium, tantalum, chromium, molybdenum, tungsten, and silicon.

3. The process according to claim 1, wherein said second metal halide gas is pulsed into, and mixed with, said first metal halide gas, during the deposition of said two-phase metal oxide layer.

4. The process according to claim 3, wherein the pulsing of the second metal halide gas into the first metal halide gas is carried out so that a size and distribution of the discontinuous metal oxide phase is determined by:

the partial pressure of the second metal halide gas;

an interval between pulses of the second metal halide gas; and a duration of pulsing of the second metal halide gas.

5. The process according to claim 4, wherein the deposition of the continuous metal oxide phase is carried out for a sufficient time before the pulsing step is initiated, so that a single-phase, continuous metal oxide layer is formed between the substrate and the two-phase metal oxide layer.

6. The process according to claim 4, wherein the pulsing of the second metal halide gas is carried out intermittently, during deposition of the first metal oxide layer, so that a stratified, wear-resistant composite ceramic coating comprising at least two two-phase metal oxide layers and at least one single-phase, continuous metal oxide layer, is formed.

7. The process according to claim 6, wherein said first metal halide gas, said volatile oxidizing agent, said second metal halide gas, and said dopant, are passed over the substrate at a temperature of from about 950° C. to 1150° C.

8. The process according to claim 3, further comprising the step of depositing between the substrate and the wear-resistant composite ceramic coating at least one intermediate layer having a thickness of from about 0.5 to 10 microns, said intermediate layer comprising at least one member selected from the group consisting of carbides, nitrides, carbonitrides, oxides, and borides, of at least one member selected from the group consisting of titanium, zirconium, hafnium, vanadium, niobium, tantalum, chromium, molybdenum, tungsten, and silicon.

9. The process according to claim 8, wherein:

a first halide gas is passed over a first metal source so that the first metal halide gas is formed, and the first metal halide gas is passed over the substrate in a reactor;

a second halide gas is passed over a second metal source so that the second metal halide gas is formed, the second metal source being within a separate vessel, the separate vessel operationally communicating with a source of the second halide gas, and with the reactor, so that the second halide gas enters the vessel, passes over the second metal source therein, and forms the second metal halide gas, which flows into the reactor and passes over the substrate.

10. The process according to claim 9, wherein the first metal source is at least one member selected from the group consisting of aluminum, a mixture of aluminum and yttrium, and salts thereof and the second metal source is at least one member selected from the group consisting of zirconium, a mixture of zirconium and yttrium, and salts thereof.

11. The process according to claim 8, wherein:

the first metal halide gas is formed by passing a first halide gas over a first metal source comprising at least one member selected from the group consisting of aluminum, an aluminum salt, zirconium, and a zirconium salt;

the second metal halide gas is formed by passing a second halide gas over a second metal source comprising at least one member selected from the group consisting of aluminum, an aluminum salt, zirconium, and a zirconium salt;

a third metal halide gas is formed by passing a third halide gas over a third metal source comprising at least one member selected from the group consisting of aluminum, an aluminum salt, yttrium, a yttrium salt, zirconium, and a zirconium salt;

the first, second, and third metal sources are each different from one another, and the first, second, and third metal halide gases are passed over the substrate at a temperature of from about 900° C. to 1250° C., and the discontinuous metal oxide phase comprises a discrete second phase of oxides of two metals selected from the group consisting of aluminum, yttrium, and zirconium.

12. The process according to claim 1, wherein said dopant is in admixture with at least one member selected from the group consisting of the carrier gas and the oxidizing gas, in an amount of from about 0.003 to 1 percent, based on a total gas volume.

13. The process according to claim 1, wherein at least one member selected from said first metal halide gas and said second metal halide gas, is passed over the substrate at a temperature of from about 950° C. to 1150° C.

14. The process according to claim 13, wherein said dopant is in admixture with at least one member selected from the group consisting of said carrier gas and said oxidizing gas, in an amount of from about 0.003 to 1 percent, based on a total gas volume.

15. The process according to claim 14, wherein said dopant is in admixture with at least one member selected from the group consisting of said carrier gas and said oxidizing gas, in an amount of from about 0.02 to 0.3%, based on a total gas volume.

16. The process according to claim 1, wherein said continuous metal oxide phase comprises aluminum oxide.

17. A process for depositing a wear-resistant composite ceramic coating on a substrate composed of at least one member selected from a group consisting of cemented carbide and ceramic, said process comprising:

passing a mixture of an aluminum halide gas, a zirconium halide gas, a volatile oxidizing gas, a carrier gas, and a sulfur based dopant, over said substrate at a temperature of from about 900° to 1250° C., at a pressure of from about 1 torr to ambient pressure, and at a partial pressure, flow rate and exposure time to deposit a two-phase, wear-resistant composite ceramic coating on said substrate, said composite ceramic coating being characterized by a two-phase metal oxide layer having a fully dense, adherent, discontinuous zirconium oxide phase including particles of zirconium oxide of said zirconium halide gas disposed within a fully dense, adherent, continuous aluminum oxide phase.

18. The process according to claim 17, further comprising depositing an intermediate layer having a thickness of from about 0.5 to 10 microns between said substrate and said wear-resistant composite ceramic coating, said intermediate layer comprising at least one member selected from the group consisting of carbides, nitrides, carbonitrides, oxides, and borides, of at least one member selected from the group consisting of titanium, zirconium, hafnium, vanadium, niobium, tantalum, chromium, molybdenum, tungsten, and silicon.

19. The process according to claim 17, wherein said zirconium halide gas is pulsed into, and mixed with, said aluminum halide gas during the deposition of said two-phase metal oxide layer.

20. The process according to claim 19, wherein the pulsing of said zirconium halide gas into said aluminum halide gas is carried out so that a size and distribution of said discontinuous zirconium oxide phase is determined by:

a partial pressure of said zirconium halide gas;

an interval between pulses of said zirconium halide gas; and a duration of pulsing of said zirconium halide gas.

21. The process according to claim 20, wherein the deposition of said continuous aluminum oxide phase is carried out for a sufficient time before the pulsing step is initiated so that a single-phase, continuous aluminum oxide layer is formed between said substrate and said two-phase metal oxide layer.

22. The process according to claim 20, wherein the pulsing of said zirconium halide gas is carried out intermittently, during the deposition of said aluminum oxide layer, so that a stratified, wear-resistant composite ceramic coating having at least two two-phase metal oxide layers and at least one single-phase, continuous aluminum oxide layer, is formed.

23. The process according to claim 22, wherein said aluminum halide gas, said volatile oxidizing agent, said zirconium halide gas, and said sulfur based dopant, are passed over said substrate at a temperature of from about 950° C. to 1150° C.

24. The process according to claim 19, further comprising the step of depositing at least one intermediate layer having a thickness of from about 0.5 to 10 microns between said substrate and said wear-resistant composite ceramic coating, said intermediate layer comprising at least one member selected from the group consisting of carbides, nitrides, carbonitrides, oxides, and borides, of at least one member selected from the group consisting of titanium, zirconium, hafnium, vanadium, niobium, tantalum, chromium, molybdenum, tungsten, and silicon.

25. The process according to claim 24, wherein:
  a first halide gas is passed over an aluminum source to form said aluminum halide gas, and said aluminum halide gas is passed over said substrate in a reactor;
  a second halide gas is passed over a zirconium source disposed within a separate vessel within said reactor to form said zirconium halide gas, said separate vessel communicating with a source of said second halide gas, and with said reactor, so that said second halide gas enters said separate vessel, passes over said zirconium source therein, forms said zirconium halide gas, which thereafter flows into said reactor and passes over said substrate.

26. The process according to claim 17, wherein said sulfur based dopant is in admixture with at least one member selected from the group consisting of said carrier gas and said oxidizing gas, in an amount of from about 0.003 to 1 percent, based on a total gas volume.

27. The process according to claim 17, wherein at least one member selected from said aluminum halide gas and said zirconium halide gas, is passed over said substrate at a temperature of from about 950° C. to 1150° C.

28. The process according to claim 27, wherein said sulfur based dopant is in admixture with at least one member selected from the group consisting of said carrier gas and said oxidizing gas, in an amount of from about 0.003 to 1 percent, based on a total gas volume.

29. The process according to claim 28, wherein said sulfur based dopant is in admixture with at least one member selected from the group consisting of said carrier gas and said oxidizing gas, in an amount of from about 0.02 to 0.3%, based on a total gas volume.

30. The process according to claim 17, wherein said sulfur based dopant comprises hydrogen sulfide ($H_2S$).

31. A process for depositing a wear-resistant composite ceramic coating on a cemented carbide substrate comprising:
  passing a first halide gas over an aluminum source to form an aluminum halide gas;
  passing a second halide gas over a zirconium source disposed within a separate vessel within a reactor to form a zirconium halide gas;
  mixing said aluminum halide gas and said zirconium halide gas with a volatile oxidizing gas, a carrier gas, and a hydrogen sulfide ($H_2S$) dopant; and
  passing said mixture over said substrate in said reactor at a temperature of from about 950° to 1150° C., at a pressure of from about 1 torr to ambient pressure, and at a partial pressure, flow rate and exposure time to deposit a two-phase, wear-resistant composite ceramic coating on said substrate, said composite ceramic coating being characterized by a two-phase metal oxide layer having a fully dense, adherent, discontinuous zirconium oxide phase including particles of zirconium oxide of said zirconium halide gas disposed within a fully dense, adherent, continuous aluminum oxide phase.

* * * * *